(12) United States Patent
Takii et al.

(10) Patent No.: US 9,380,711 B2
(45) Date of Patent: Jun. 28, 2016

(54) SUBSTRATE MANUFACTURING METHOD

(75) Inventors: Shukichi Takii, Ayase (JP); Noriaki Taneko, Ayase (JP); Shigeru Michiwaki, Ayase (JP); Mitsuho Kurosu, Ayase (JP); Yuichiro Naya, Ayase (JP)

(73) Assignee: MEIKO ELECTRONICS CO., LTD., Ayase-shi, Kanagawa (JP)

( * ) Notice: Subject to any disclaimer, the term of this patent is extended or adjusted under 35 U.S.C. 154(b) by 0 days.

(21) Appl. No.: 14/346,281

(22) PCT Filed: Sep. 30, 2011

(86) PCT No.: PCT/JP2011/072588
§ 371 (c)(1),
(2), (4) Date: Mar. 20, 2014

(87) PCT Pub. No.: WO2013/046441
PCT Pub. Date: Apr. 4, 2013

(65) Prior Publication Data
US 2014/0224762 A1    Aug. 14, 2014

(51) Int. Cl.
*H01B 13/00* (2006.01)
*B23P 15/00* (2006.01)
*C03C 25/00* (2006.01)
*C23F 1/00* (2006.01)
(Continued)

(52) U.S. Cl.
CPC .......... *H05K 3/125* (2013.01); *H01L 21/76802* (2013.01); *H05K 3/1258* (2013.01); *H05K 3/4673* (2013.01); *H01L 2221/101* (2013.01); *H05K 3/3452* (2013.01); *H05K 2203/013* (2013.01); *H05K 2203/10* (2013.01); *H05K 2203/107* (2013.01)

(58) Field of Classification Search
None
See application file for complete search history.

(56) References Cited

U.S. PATENT DOCUMENTS

2004/0237295 A1* 12/2004 Wakizaka et al. ............... 29/830
2006/0185140 A1*  8/2006 Andresakis et al. ......... 29/25.41
(Continued)

FOREIGN PATENT DOCUMENTS

JP    2006-121039 A    5/2006
JP    2006-140437 A    6/2006
(Continued)

OTHER PUBLICATIONS

International Search Report for PCT/JP2011/072588, mailed Nov. 8, 2011.
(Continued)

*Primary Examiner* — Stephanie Duclair
(74) *Attorney, Agent, or Firm* — Marshall, Gerstein & Borun LLP

(57) ABSTRACT

A substrate manufacturing method includes an inner layer circuit forming step for partially removing metal films from an insulating base material (2), on both surfaces of which the metal films are stuck, and forming an inner layer circuit (3); and an insulating layer forming step for applying first insulating resin (4) to each of both the surfaces of the insulating base material (2) with an inkjet system and forming an insulating layer (5). In the insulating layer forming step, a via hole (6) from which the inner layer circuit (3) is partially exposed is formed simultaneously with the application of the first insulating resin (4). Consequently, a step of separately forming a via hole with a laser or the like is unnecessary, expenses are relatively low, and it is possible to simplify a manufacturing process.

4 Claims, 5 Drawing Sheets

(51) Int. Cl.
*H05K 3/12* (2006.01)
*H01L 21/768* (2006.01)
*H05K 3/46* (2006.01)
*H05K 3/34* (2006.01)

(56) References Cited

U.S. PATENT DOCUMENTS

2007/0141828 A1* 6/2007 Shintate et al. ............... 438/618

2009/0205859 A1* 8/2009 Tanaka et al. ................. 174/260

FOREIGN PATENT DOCUMENTS

| JP | 2008-034880 A | 2/2008 |
| JP | 2009-010266 A | 1/2009 |

OTHER PUBLICATIONS

Written Opinion for PCT/JP2011/072588, mailed Nov. 8, 2011.

* cited by examiner

SUBSTRATE MANUFACTURING METHOD

TECHNICAL FIELD

The present invention relates to a substrate manufacturing method using an inkjet technique.

BACKGROUND ART

Conventionally, when a multilayer substrate (HDI) is manufactured in which high-density connection is realized by formation of via holes, in formation of an insulating layer of the multilayer substrate, a prepreg and a copper foil are laminated and cured by vacuum press or the like, the copper foil in a via hole forming portion is removed by etching or the like, and, then, the via holes are formed by laser machining. Alternatively, surface treatment is applied to the copper foil and the via holes are directly formed by the laser machining.

As another method of forming via holes, there is a method of uniformly applying varnish-like ink resin over the entire both surfaces of a rigid core substrate with screen printing, a curtain coat, a roll coater, a spray, or the like and, then, forming the via holes with exposure and development (when the resin is photosensitive) or forming the via holes with a laser in the same manner as the prepreg (see, for example, Patent Document 1).

However, in these methods, when the laser is used, an expensive laser machining apparatus is necessary. Some laser machining conditions may cause a connection failure. When photosensitive resin is used, the resin does not always have a sufficient characteristic as a material to be formed as an insulating layer of a substrate and does not have a degree of freedom of material selection. Photosensitive resin that can be used for the substrate is generally expensive.

PRIOR ART DOCUMENT

Patent Document

Patent Document 1: Japanese Patent Application Laid-Open Publication No. 2009-10266

SUMMARY OF THE INVENTION

Problem to be Solved by the Invention

The present invention is a substrate manufacturing method that is relatively inexpensive and can simplify a manufacturing process compared with a method of forming via holes using a laser or photosensitive resin.

Means for Solving the Problem

The present invention provides a substrate manufacturing method including: an inner layer circuit forming step for partially removing metal films from an insulating base material, on both surfaces of which the metal films are stuck, and forming an inner layer circuit; and an insulating layer forming step for applying first insulating resin to each of both the surfaces of the insulating base material with an inkjet system and forming an insulating layer, wherein, in the insulating layer forming step, a via hole from which the inner layer circuit is partially exposed is formed simultaneously with the application of the first insulating resin.

Preferably, in the insulating layer forming step, the first insulating resin is ultraviolet curing resin, and, immediately after the first insulating resin impacts on the surface of the insulating base material, an ultraviolet ray is irradiated on the impact position.

Preferably, in the insulating layer forming step, after the first insulating resin is hit on a position surrounding a position to be formed as the via hole, the first insulating resin is cured to form a bank section, and, thereafter, the insulating layer is formed.

Preferably, after the inner layer circuit forming step and before the insulating layer forming step, corona treatment, low-pressure UV irradiation treatment, or plasma treatment is applied to the surface of the insulating base material on which the inner layer circuit is formed.

Preferably, the substrate manufacturing method further comprises: an outer layer circuit forming step for forming an outer layer circuit made of conductive metal on the surface of the insulating layer after the insulating layer forming step; and a resist layer forming step for applying second insulating resin to a selective position on the surface of the insulating layer with the inkjet system and forming a resist layer.

Advantageous Effects of the Invention

According to the present invention, since the insulating layer is formed by the inkjet system, it is possible to form the via hole simultaneously with the formation of the insulating layer. Consequently, a step of separately forming a via hole with a laser or the like is unnecessary, expenses are relatively low, and it is possible to simplify a manufacturing process.

The first insulating resin is ultraviolet curing resin, and, immediately after the first insulating resin impacts on the surface of the insulating base material, an ultraviolet ray is irradiated on the impact position. Therefore, it is possible to prevent the first insulating resin from wetting and spreading more than necessary.

After the first insulating resin is impacted on a position surrounding a position to be formed as the via hole, the first insulating resin is cured to form a bank section, and, thereafter, the insulating layer is formed. Therefore, the position of the via hole is set in advance by the bank section. Consequently, it is possible to surely form the via hole.

Corona treatment, low-pressure UV irradiation treatment, or plasma treatment is applied to the surface of the insulating base material on which the inner layer circuit is formed. Therefore, it is possible to perform surface reforming of the insulating base material and optimize wettability for the first insulating resin. In particular, it is useful to apply such optimization of wettability to an insulating base material in which resin and copper are mixed. The corona treatment is preferable when costs of an apparatus, running costs, and the like are taken into account.

A resist layer is formed by the inkjet system. Therefore, it is possible to form a resist layer in which a via hole portion is opened. A step for separately opening a via hole portion in a resist is unnecessary.

MODE FOR CARRYING OUT THE INVENTION

Figure 1:
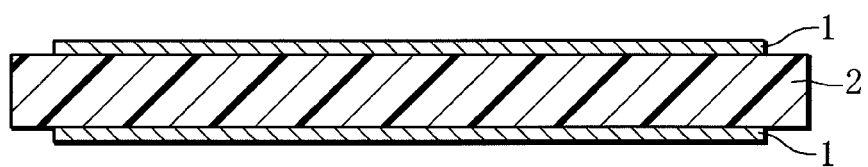
FIG. 1 is a schematic diagram showing a substrate manufacturing method according to the present invention in order.
Figure 2:
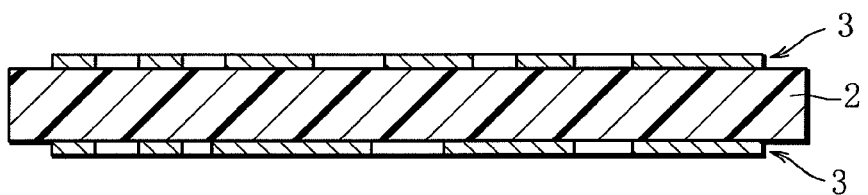
FIG. 2 is a schematic diagram showing the substrate manufacturing method according to the present invention in order.

In a substrate manufacturing method according to the present invention, first, an inner layer circuit forming step is performed. In the inner layer circuit forming step, first, as shown in FIG. 1, an insulating base material 2, on both surfaces of which metal films 1 are stuck, is prepared. For example, the metal films 1 are copper foils. As shown in FIG. 2, the metal films 1 are partially removed to form a patterned inner layer circuit 3.

Figure 3:
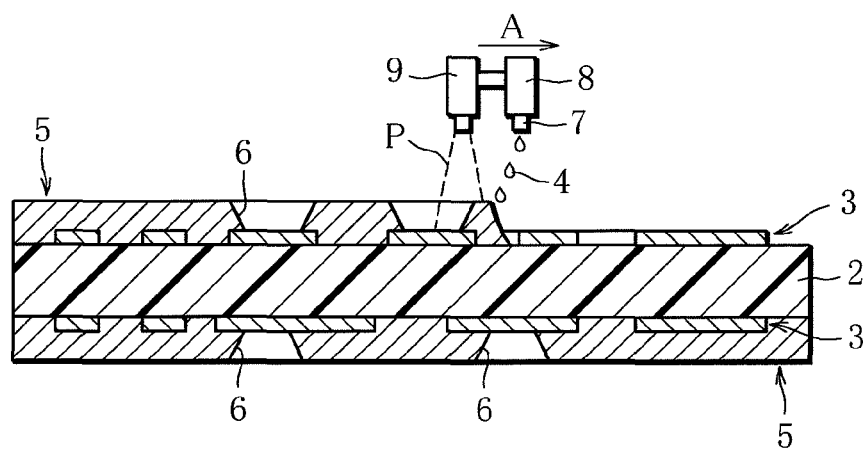
FIG. 3 is a schematic diagram showing the substrate manufacturing method according to the present invention in order.
Figure 4:
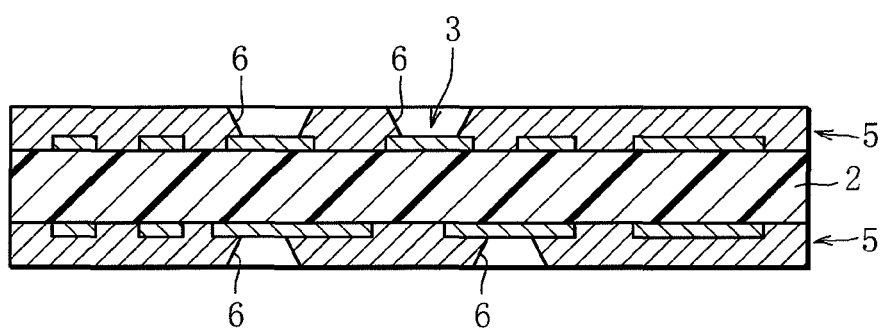
FIG. 4 is a schematic diagram showing the substrate manufacturing method according to the present invention in order.

Subsequently, an insulating layer forming step is performed. In the insulating layer forming step, as shown in FIG. 3, first insulating resin 4 is applied to each of both the surfaces of the insulating base material 2 by an inkjet system to form an insulating layer 5. The first insulating resin 4 is sprayed from a nozzle 7 of a spraying device 8 using a publicly known inkjet apparatus and impacts on the insulating base material 2 (or the inner layer circuit 3). The nozzle 7 moves in one direction with respect to the insulating base material 2 (an arrow A direction in FIG. 3). In this case, the first insulating resin 4 is selectively hit on the insulating base material 2 making use of a characteristic of the inkjet system and via holes 6 are simultaneously formed. The via holes 6 are formed in positions where the inner layer circuit 3 is partially exposed. Therefore, the via holes 6 are formed simultaneously with applying the first insulating resin to form the insulating layer 5. If the insulating layer 5 is formed by the inkjet system in this way, a step of separately forming the via holes 6 with a laser or the like is unnecessary, expenses are relatively low, and it is possible to simplify a manufacturing process. The insulating layer 5 is formed for each one surface of the insulating base material 2 and is finally formed on both the surfaces of the insulating base material 2. Through this step, as shown in FIG. 4, the insulating layer 5 is formed in which the via holes 6 are formed.

In the formation of the via holes 6 at this point, desmear treatment for via bottoms is unnecessary. When the via holes 6 are formed using the laser or the like as explained above, smears occur on the via bottoms. Therefore, the desmear treatment is necessary to prevent a connection failure on the via bottoms. However, in the present invention in which the insulating layer 5 and the via holes 6 are simultaneously formed, such smears do not occur. Therefore, the desmear treatment is unnecessary. In particular, if the inkjet system is used, the insulating layer 5 is formed while being immediately cured by an ultraviolet ray. Therefore, a liquid flow does not occur and the shape of the insulating layer 5 is not deformed. By changing the size and the pitch of droplets, it is possible to form the via holes 6 having a small diameter (in a micrometer size). Such an effect is particularly advantageous compared with the case in which the insulating layer 5 and the via holes 6 are simultaneously formed using screen printing. That is, in the screen printing, since it takes time until an insulating layer is cured, it is likely that a liquid flow occurs and the shape of the insulating layer is deformed. Further, in the screen printing, it is difficult to form via holes having a small diameter.

In order to accurately form the via holes 6 or form the via holes 6 having a small diameter, it is necessary to reduce the size of droplets of the first insulating resin 4 by the inkjet system and increase resolution. As this method, there is a method of simply making a nozzle pitch of an inkjet head smaller. Alternatively, for example, there is a method of combining a plurality of nozzle heads and arranging nozzle positions to be shifted from one another or attaching a head obliquely to a traveling direction of the head to make a substantial nozzle pitch smaller. When such a method is used, since it is necessary to impact droplets with ejection timings of the droplets shifted from one another, it is necessary to enable a computer and a program of the computer for controlling an apparatus to be adapted to the method.

In order to be adapted to the inkjet system, as the first insulating resin 4 to be ejected and applied, insulating resin having viscosity usable in an inkjet apparatus is used. In particular, a wetting and spreading property at the time when the first insulating resin 4 for forming the insulating layer 5 impacts on both of the insulating base material 2 and the inner layer circuit 3 is important. When the wetting and spreading property is large, the first insulating resin 4 flows into the via holes 6 to be formed and flows out to the outer side of the insulating base material 2 to cause deterioration in resolution or make it difficult to control application thickness. When the wetting and spreading property is small, in an extreme case, droplets are cured while remaining in a ball shape or repel liquid.

To optimize the wetting and spreading property, wettability of the insulating base material 2 applied with the first insulating resin 4 has to be optimized. In particular, it is useful to apply such optimization of wettability to the insulating base material 2 in which resin (the insulating base material 2) and copper (the inner layer circuit 3) are mixed, which is the premise of the present invention. For the optimization, after the inner layer circuit forming step and before the insulating layer forming step, corona treatment, low-pressure UV irradiation treatment, or plasma treatment has to be applied to the surface of the insulating base material 2 on which the inner layer circuit 3 is formed. Consequently, it is possible to perform surface reforming of the insulating base material 2 and optimize wettability for the first insulating resin 4. The corona treatment is preferable when costs of an apparatus, running costs, and the like are taken into account.

The inkjet apparatus further includes an irradiating device 9 for irradiating an ultraviolet ray. The irradiating device 9 is movable to follow the spraying device 8 in a moving direction A. Specifically, in the case of a structure in which the irradiating device 9 is attached on the extension of the inkjet head of the inkjet apparatus and the inkjet head moves, the irradiating device 9 simultaneously moves. If the first insulating resin 4 is ultraviolet curing resin, immediately after the first insulating resin 4 impacts on the surface of the insulating base material 2, an ultraviolet ray P is irradiated on the impact position. Consequently, the first insulating resin 4 is cured or half-cured. It is possible to prevent the first insulating resin 4 from wetting and spreading more than necessary. As the curing, at least the resin 4 only has to solidify to a degree not to flow. By curing the resin 4 immediately after the impacting in this way, a pre-cure step necessary in applying the resin 4 to each of the surfaces of the insulating base material 2 is unnecessary. Note that it is preferable that the first insulating resin 4 is ultraviolet-curing or thermosetting resin and, after the insulating layer 5 is formed, heat treatment is performed to cure the first insulating resin 4.

In the insulating layer forming step, as explained above, the inner layer circuit 3 is formed on the insulating base material 2. Therefore, the insulating base material 2 is formed in an uneven shape. When the screen printing or the like is applied to such a place, the uneven shape remains on the surface after printing as well. In the inkjet system applied with the present invention, since a large amount of resin can be applied targeting concave portions of the uneven shape, it is possible to make the surface even.

Figure 10:
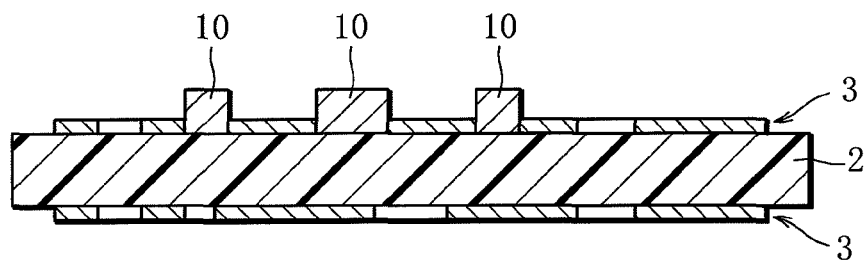
FIG. 10 is a schematic diagram showing an example in which bank sections are formed.

In performing the insulating layer forming step, it is also possible that the first insulating resin 4 is impact on a position surrounding positions to be formed as the via holes 6 and cured to form bank sections 10 (see FIG. 10) and, thereafter, the insulating layer 5 may be formed. Specifically, several dots (droplets) are applied around the positions to be formed as the via holes 6 to form the bank sections 10, the bank sections 10 are cured, and, then, the first insulating resin 4 is applied to the outer side (a side where the via holes 6 are not formed) of the bank section 10. In this case, it is also possible to, for example, change the viscosity of resin applied to form the bank sections 10 and the viscosity of resin applied thereafter and planarize the resin. If such bank sections 10 are formed and, thereafter, the insulating layer 5 is formed, the positions of the via holes 6 are set in advance by the bank sections 10. Consequently, it is possible to surely form the via holes 6. This can also be applied when it is desired to partially increase the insulating layer 5 in thickness in packaging and use.

As a method of applying the first insulating resin 4, there is a method of, in first application, impacting the first insulating resin 4 at intervals and drying the first insulating resin 4 and, in second application, impacting the first insulating resin 4 targeting gaps among the portions impact in the first application.

When a resin layer having a certain degree of thickness (about 40 μm to 80 μm) is formed like a buildup insulating layer and, in particular, when droplets are reduced in size in order to increase resolution, necessary insulating layer thickness cannot be obtained only by one application. In this case, there is a method of performing a plurality of times of application or mounting a plurality of heads to obtain necessary thickness. However, to keep the shape of opening sections to which the first insulating resin 4 is not applied, it is desirable to adopt a method of, after applying the first insulating resin 4 once, curing the first insulating resin 4 to a certain degree with an ultraviolet ray or the like to keep the shape and, then, applying the first insulating resin 4 for the second and subsequent times.

Figure 5:
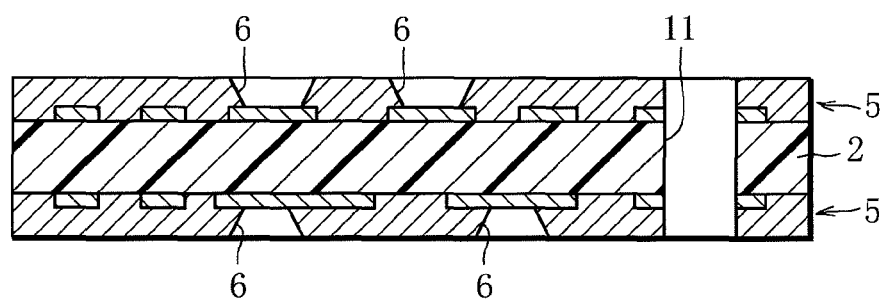
FIG. 5 is a schematic diagram showing the substrate manufacturing method according to the present invention in order.
Figure 6:
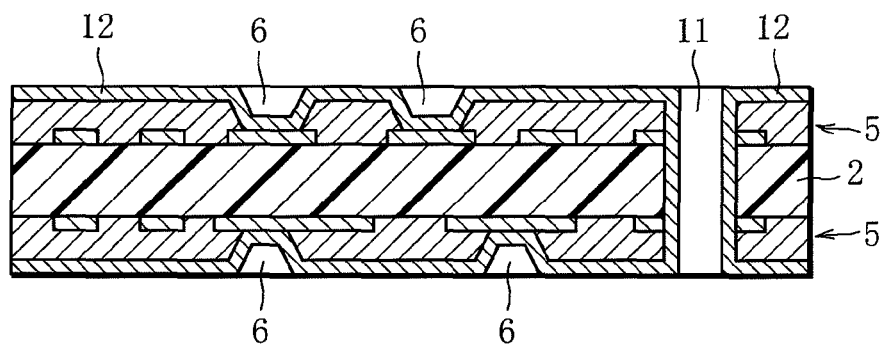
FIG. 6 is a schematic diagram showing the substrate manufacturing method according to the present invention in order.
Figure 7:
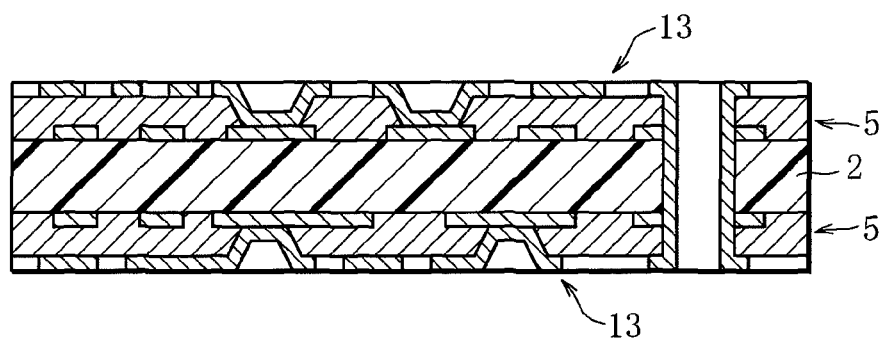
FIG. 7 is a schematic diagram showing the substrate manufacturing method according to the present invention in order.

After the insulating layer forming step described above, an outer layer circuit forming step is performed. In the outer layer circuit forming step, as shown in FIG. 5, a through-hole 11 piercing through the insulating layer 5 and the insulating base material 2 is formed. The through-hole is formed using a drill bit or the like. Then, plating is performed and, as shown in FIG. 6, a plating film 12 is formed on the surface of the insulating layer 5, the inner surface of the through-hole 11, and the inner surfaces of the via holes 6. The plating film 12 is made of conductive metal, for example, copper. Then, the plating film 12 is partially removed using etching or the like. As shown in FIG. 7, an outer layer circuit 13 is formed on the surface of the insulating layer 5.

Figure 8:
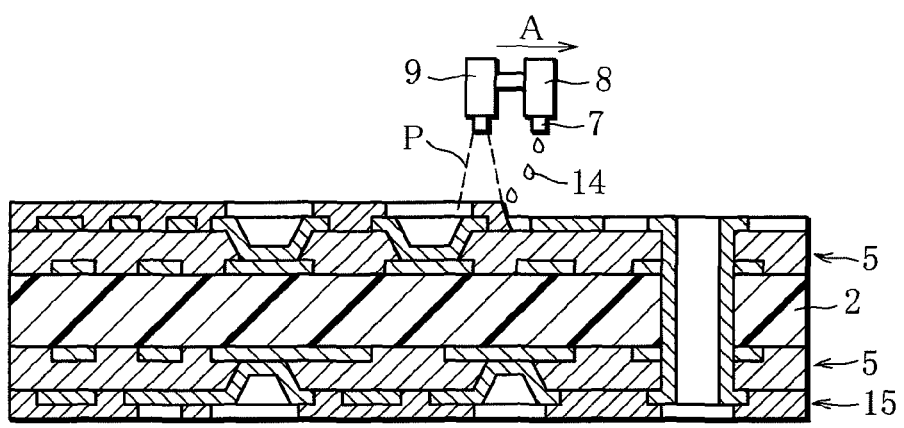
FIG. 8 is a schematic diagram showing the substrate manufacturing method according to the present invention in order.
Figure 9:
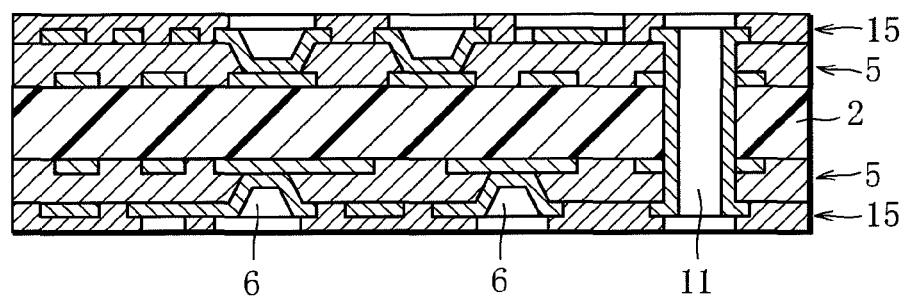
FIG. 9 is a schematic diagram showing the substrate manufacturing method according to the present invention in order.

Subsequently, a resist layer forming step is performed. In the resist layer forming step, as shown in FIG. 8, second insulating resin 14 is selectively applied to the outer layer circuit 13 by the inkjet system. In general, the second insulating resin 14 is applied to the outer layer circuit 13 excluding at least the via holes 6 and the through-hole 11. The second insulating resin 14 is applied on the outer layer circuit 13 and a resist layer 15 is formed. By using the inkjet system for the formation of the resist layer 15 as well, it is possible to form a resist layer (a solder resist) 15 opened in via hole portions. A step of separately opening via hole portions in a resist is unnecessary. Concerning the application of the second insulating resin 14 in the inkjet system, a method same as the method of applying the first insulating resin 4 described above can be used. It is possible to obtain the same effect.

As explained above, in the present invention, the insulating layer 5 and the resist layer 15 of a buildup substrate (HDI) are formed by selective application of an insulating resin by inkjet. An application range of inkjet droplets is prepared in advance as printing data of the inkjet such that the inkjet droplets are not applied to the via holes 6 during the formation of the insulating layer 5 and is not applied to portions or the like corresponding to the via holes 6 during the formation of the resist layer 15. Consequently, it is possible to provide the via holes 6 and the opening of the resist simultaneously with the formation of the insulating layer 5 and the resist layer 15, the process is simplified, and it is possible to manufacture an inexpensive buildup substrate.

EXPLANATION OF REFERENCE SIGNS

1 Metal film
2 Insulating base material
3 Inner layer circuit
4 First insulating resin
5 Insulating layer
6 Via hole
7 Nozzle
8 Spraying device
9 Irradiating device
10 Bank section
11 Through-hole
12 Plating film
13 Outer layer circuit
14 Second insulating resin
15 Resist layer
P Ultraviolet ray

The invention claimed is:
1. A substrate manufacturing method, comprising the steps of:
partially removing metal films stuck on opposing surfaces of an insulating base material to form an inner layer circuit;
forming a bank section on the insulating base material by impacting a first insulating resin directly on the insulating base material alone with an inkjet system in a position surrounding a position to be formed as a via hole and curing the first insulating resin to form the bank section; and
applying an additional insulating resin having a viscosity identical to or different from that of the first insulating resin to the insulating base material and the inner layer circuit with an inkjet system to form an insulating layer having the via hole, through which the inner layer circuit is partially exposed.
2. The substrate manufacturing method according to claim 1, wherein the first insulating resin is ultraviolet curing resin, and, immediately after the first insulating resin impacts on the surface of the insulating base material, an ultraviolet ray is irradiated on the impact position.

3. The substrate manufacturing method according to claim 1, further comprising the step of applying a corona treatment, low-pressure UV irradiation treatment, or plasma treatment to a surface of the insulating base material on which the inner layer circuit is formed after the metal films are removed from the insulating base material and before the first insulating resin is impacted on the insulating base material.

4. The substrate manufacturing method according to claim 1, further comprising the steps of:
   forming an outer layer circuit made of conductive metal on a surface of the insulating layer after the additional insulating resin is applied to the insulating base material and the inner layer circuit; and
   applying a second insulating resin to a selective position on the surface of the insulating layer with the inkjet system and forming a resist layer.

* * * * *